(12) United States Patent
Lai

(10) Patent No.: US 9,933,121 B2
(45) Date of Patent: Apr. 3, 2018

(54) METHOD OF MAKING LED LIGHT BULB WITH GRAPHENE FILAMENT

(71) Applicant: Chung-Ping Lai, Zhubei (TW)

(72) Inventor: Chung-Ping Lai, Zhubei (TW)

( * ) Notice: Subject to any disclaimer, the term of this patent is extended or adjusted under 35 U.S.C. 154(b) by 0 days.

(21) Appl. No.: 14/721,021

(22) Filed: May 26, 2015

(65) Prior Publication Data

US 2017/0299129 A1    Oct. 19, 2017

(51) Int. Cl.
| | |
|---|---|
| *C10B 49/02* | (2006.01) |
| *F21K 9/90* | (2016.01) |
| *H05K 1/02* | (2006.01) |
| *H05K 3/00* | (2006.01) |
| *H05K 1/18* | (2006.01) |
| *H01L 33/50* | (2010.01) |
| *H05K 1/09* | (2006.01) |
| *H01L 33/64* | (2010.01) |
| *F21K 9/232* | (2016.01) |
| *F21K 9/237* | (2016.01) |
| *F21V 29/85* | (2015.01) |
| *F21V 19/00* | (2006.01) |
| *F21Y 115/10* | (2016.01) |

(52) U.S. Cl.
CPC ............... *F21K 9/90* (2013.01); *F21K 9/232* (2016.08); *F21K 9/237* (2016.08); *F21V 19/003* (2013.01); *F21V 29/85* (2015.01); *H01L 33/507* (2013.01); *H01L 33/641* (2013.01); *H05K 1/028* (2013.01); *H05K 1/0209* (2013.01); *H05K 1/09* (2013.01); *H05K 1/181* (2013.01); *H05K 3/0052* (2013.01); *F21Y 2115/10* (2016.08); *H01L 2933/0075* (2013.01); *H05K 2201/10106* (2013.01)

(58) Field of Classification Search
CPC ...... F21S 48/212; F21S 48/1233; F21S 48/33; F21S 48/215; F21S 48/115; F21S 48/1109; H01L 33/62; H01L 25/0753; H01L 33/34
See application file for complete search history.

(56) References Cited

U.S. PATENT DOCUMENTS

| | | | | |
|---|---|---|---|---|
| 4,490,649 A | * | 12/1984 | Wang | H01J 61/827 313/112 |
| 5,581,152 A | * | 12/1996 | Matsuno | H01J 65/00 313/113 |
| 2006/0273720 A1 | * | 12/2006 | Kwong | H01J 5/54 313/569 |
| 2011/0141748 A1 | * | 6/2011 | Lee | F21V 19/0025 362/363 |

(Continued)

Primary Examiner — Tracie Y Green

(57) ABSTRACT

A method of making a LED light bulb with the Graphene filament contains steps of: A. providing a flexible substrate, wherein the flexible substrate is flexible printed circuit board (PCB); B. coating graphene-based heat dissipation ink on a back side of the flexible substrate; C. cutting the printed circuit board (PCB) on which a graphene-based heat dissipation film is coated to form plural Graphene filaments; D. fixing the plural Graphene filaments into a light bulb. The flexible substrate has copper lines formed on both sides thereof for electronic circuits and heat conduction, and LED chips are mounted on a front side of the flexible substrate. The graphene-based heat dissipation ink is coated on the back side of the flexible substrate before or after LED chips/phosphor molding and then is dried. In addition, the Graphene filaments are fixed in a bended or arched position.

10 Claims, 4 Drawing Sheets

(56) References Cited

U.S. PATENT DOCUMENTS

| | | | |
|---|---|---|---|
| 2011/0163681 A1* | 7/2011 | Dau | F21V 19/003 315/191 |
| 2011/0248631 A1* | 10/2011 | Chuang | F21V 3/00 315/32 |
| 2012/0032577 A1* | 2/2012 | Huang | F21V 3/02 313/318.01 |
| 2012/0049739 A1* | 3/2012 | Clough | F21L 4/00 315/113 |
| 2012/0217862 A1* | 8/2012 | Matsuda | F21K 9/232 313/46 |
| 2013/0058080 A1* | 3/2013 | Ge | F21V 3/00 362/231 |
| 2017/0016582 A1* | 1/2017 | Yang | F21K 9/232 |

* cited by examiner

US 9,933,121 B2

METHOD OF MAKING LED LIGHT BULB WITH GRAPHENE FILAMENT

FIELD OF THE INVENTION

The present invention relates to a method of making LED light bulb, and more particularly to a method of making LED light bulb with Graphene filament.

BACKGROUND OF THE INVENTION

A conventional light bulb is disclosed in US Publication No. 20140211475 and contain: a light-emitting module; a heat-dissipation carrier including a first surface and a second surface opposite to the first surface, disposed under the light-emitting module for conducting heat generated by the light-emitting module away from the light-emitting module; and a heat radiator disposed above the heat-dissipation carrier for radiating heat away from the heat-dissipation carrier, wherein the material of the heat-radiating material coated on the surface of the heat radiator can include carbon-containing compound such as SiC, graphene, metal oxide such as ZnO, or III-nitride compound such as BN. However, as high-power LED bulb is required to generate enough light for illumination purpose rather than direction light, the heat-dissipation design became insufficient so that the heat-dissipation carrier is often enlarged to be bulky metal heat skin, and more effective heat spreading materials are required. The developed thermal management of LED bulb increases the cost of bulbs and the cooling structure is both bulky and heavy that offsets the benefits of LED.

For light bulb application, thermal conductivity only allows heat to be conducted downward to the base. Honestly speaking, this is not efficient because filament will be connected to electronics which generate more heat. Furthermore, the power electronics will be kept in the very tight enclosure like E27/GU10 connector. The heat dissipation is problematic. Graphene has been well-known for its outstanding heat conductivity, and high surface area. Both properties indicate graphene to be a promising candidate of heat-spreading solution. However, relative designs in recent years show several shortages.

US Publication 20100085713 proposed lateral graphene as heat spreaders for electronic device and circuits. The integration process, either growing graphene by CVD process or transferring exfoliated graphene, is high cost and fairly complicated, which is not favorable for commercialization. Graphene film/papers are proposed as heat spreaders such as US publication 20130329366 and US Publication 20140224466. Graphene films were produced from graphene nanoplatelets. By compression, graphene films were formed. However, the adhesion of films onto heat source or heat sink may create another heat resistance between interfaces, and lower the heat dissipation effect.

The present invention has arisen to mitigate and/or obviate the afore-described disadvantages.

SUMMARY OF THE INVENTION

The primary objective of the present invention is to provide a method of making LED light bulb with Graphene filament on which graphene ink is coated to remove heat away from heat source very rapidly.

Another objective of the present invention is to provide a method of making LED light bulb with Graphene filament which takes advantage of unique cooling ability of graphene.

To obtain above objectives, a method of making LED light bulb with Graphene filament provided by the present invention contains steps of:

A. providing a flexible substrate, wherein the flexible substrate is flexible printed circuit board (PCB) and has copper lines formed on both sides thereof for electronic circuits and heat conduction, and LED chips are mounted on a front side of the flexible substrate.

B. coating graphene-based heat dissipation ink on a back side of the flexible substrate before or after LED chips/phosphor molding, and then drying the graphene-based heat dissipation ink on the back side of the flexible substrate.

C. cutting the printed circuit board (PCB) on which a graphene-based heat dissipation film is coated to form plural Graphene filaments;

D. fixing the plural Graphene filaments into a light bulb, where filaments are arranged in bended or arched fixing position.

Preferably, the flexible substrate has copper lines formed on both sides thereof for electronic circuits and heat conduction, and LED chips are mounted on a front side of the flexible substrate.

Preferably, the graphene-based heat dissipation ink is coated on the back side of the flexible substrate before or after LED chips/phosphor molding and then is dried.

Preferably, the graphene-based heat dissipation ink consists of graphene, heat dissipation fillers, dispersants and binders, such that the graphene-based heat dissipation ink takes both lateral heat spreading ability and heat radiation ability to dissipate heat.

Preferably, the graphene-based heat dissipation film is coated by any one of spray coating, brushing, screen printing, or nozzle printing via the graphene-based heat dissipation ink.

Preferably, the Graphene filaments are fixed in a bended or arched position.

Preferably, the heat dissipation fillers are carbon materials, metal particles and far infrared-ray radiation powders.

Preferably, the carbon materials include graphene, carbon black, graphite, carbon nanotubes, activated carbon.

Preferably, the metal particles include Cu, Ni, Zn, Fe, Co, Ag, Au, Pt and their alloys.

Preferably, the far infrared-ray radiation powders include $SiO_2$, $Al_2O_3$, $TiO_2$, $ZrO_2$, $ZrC$, $SiC$, $TaC$, $TiB_2$, $ZrB_2$, $TiSi_2$, $Si_3N_4$, $TiN$, $BN$.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 1:
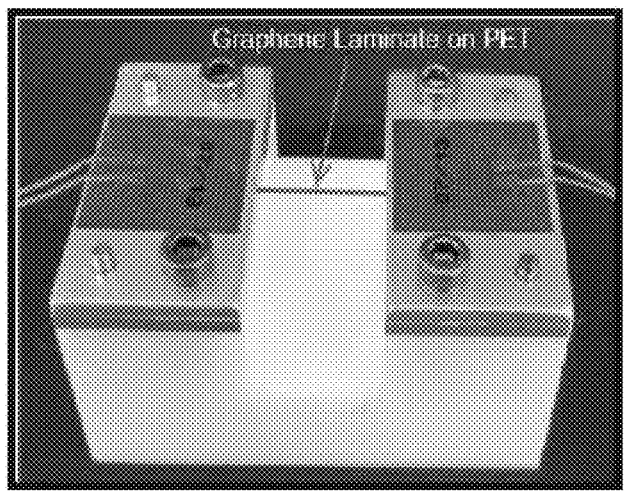
FIGS. 1 and 2 show graphene laminate film is deposited on a polyethylene terephthalate (PET) substrate, and a thermal conductivity of the graphene laminate film is in a range from 40 to 90 W/mk at room temperature.
Figure 2:
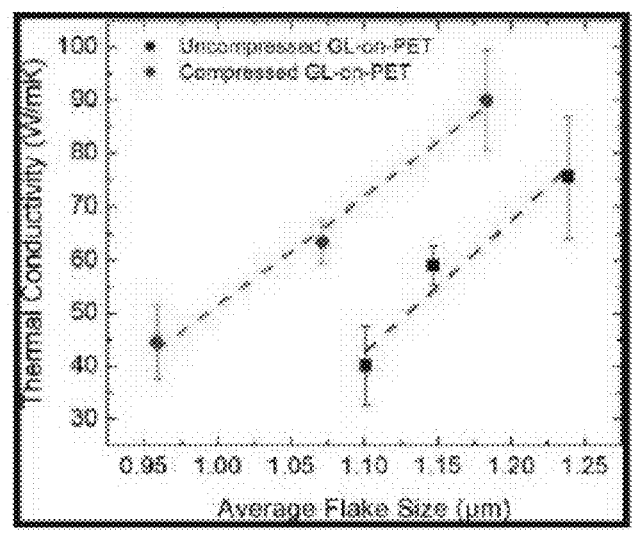

With reference to FIGS. 1 to 2, a graphene laminate film is deposited on a polyethylene terephthalate (PET) substrate, and the thermal conductivity of the graphene laminate film is found to be in a range from 40 to 90 W/mk at room temperature, which provides up to 600× higher thermal conductivity than plastics. Thus, a LED light bulb with Graphene filament made of graphene laminate film removes heat away from heat source very rapidly.

Figure 3:
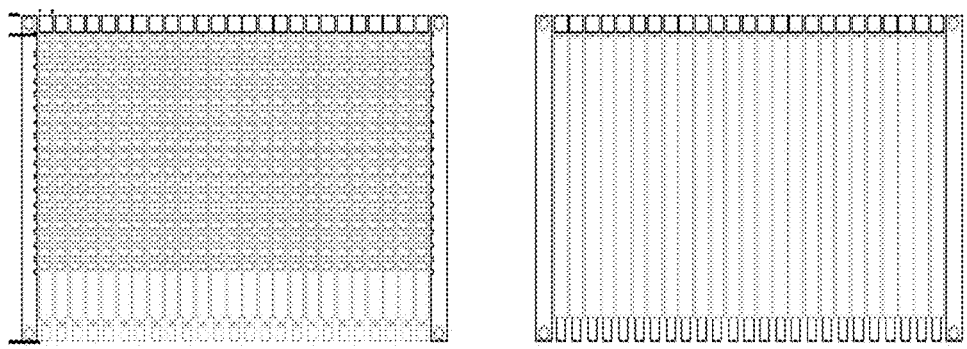
FIGS. 3 to 9 show a LED light bulb with the Graphene filament according to a preferred embodiment of the present invention is made.
Figure 4:
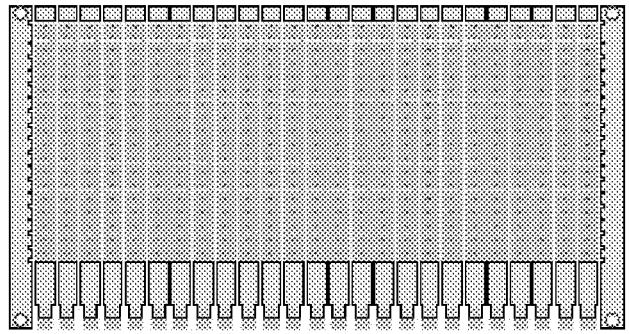
Figure 5:
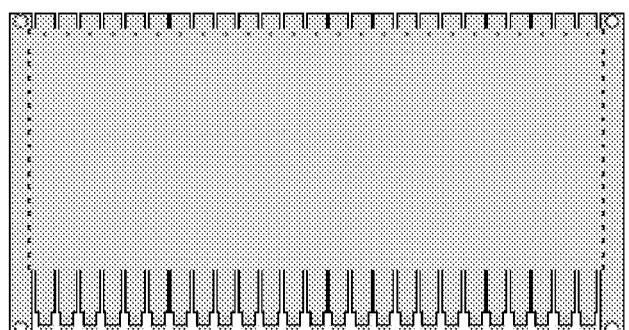

Referring to FIGS. 3 to 9, a method of making LED light bulb with the Graphene filament according to a preferred embodiment comprises steps of:

A. providing a flexible substrate such as flexible printed circuit board (PCB); both sides of the substrate have metal lines formed not only for electronic circuits but also for heat conduction. LED chips are mounted on the front side. Processes are shown in FIG. 3 to FIG. 5. FIG. 3 shows the front side (left) and the back side (right) of the flexible substrates with circuits on both sides. LEDs are then bonded on the front side (FIG. 4). Afterwards, phosphor molding is applied (FIG. 5.)

Figure 6:
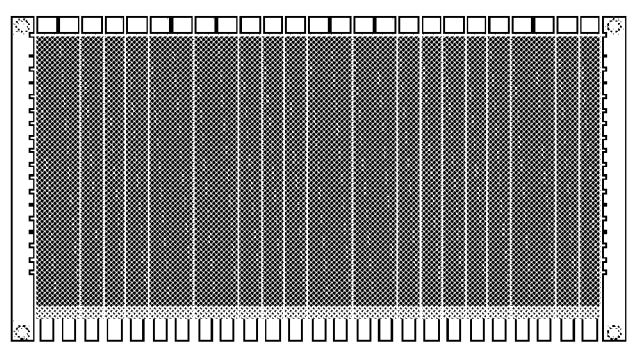

B. coating graphene-based heat dissipation ink on a back side of the flexible substrate such as flexible printed circuit board (PCB) as shown in FIG. 6; the coating process is employed before or after LED chips/phosphor molding, and is dried by traditional drying process so that a graphene-based radiation film forms on the back side of the flexible substrate after drying the graphene-based heat dissipation ink is dried by the traditional drying process. The post-processing not only prevents expensive and complicated procedures such as CVD, but also eliminates the bulky heat sinks or heavy bulb metal shell. graphene-based heat dissipation ink in this invention is consisted of graphene, heat dissipation fillers, dispersants and binders, can take advantage of heat radiation effect, besides high lateral heat conduction and high surface area. Heat dissipation fillers can be carbon materials (e.g., graphene, carbon black, graphite, carbon nanotubes, activated carbon), metal particles (e.g., Cu, Ni, Zn, Fe, Co, Ag, Au, Pt and their alloys) and far infrared-ray radiation powders (e.g., $SiO_2$, $Al_2O_3$, $TiO_2$, $ZrO_2$, ZrC, SiC, TaC, $TiB_2$, $ZrB_2$, $TiSi_2$, $Si_3N_4$, TiN, BN). The coating could be applied by spray coating, brushing, screen printing, or nozzle printing.

Figure 7:
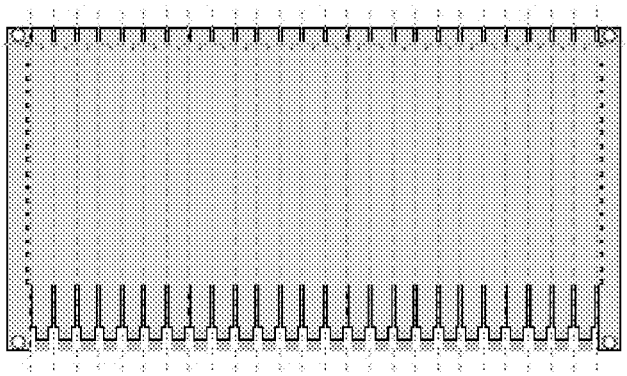
Figure 8:

C. Cutting the printed circuit board (PCB) on which the graphene-based radiation film is formed so as to produce plural Graphene filaments; Due to coating on large area beforehand, cut Graphene filaments can have homogeneous graphene coating on the backside without defects, as shown in FIG. 7 and FIG. 8.

Figure 9:
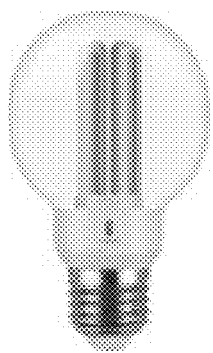

D. fixing the plural Graphene filaments into a light bulb as shown in FIG. 9. Because the substrate of Graphene filaments is flexible, filaments fixed into a light bulb may not necessary to be orthogonal vertical. Filaments can be designed in bended or arched fixing position that gives variety of filament arrays design.

The Graphene filament structure integrates high heat-conduction of metal and high lateral heat-spreading ability of graphene. Heat generated by LED on the filament is localized under each LED chip. By this design, heat can be conducted fast outward by metal, and spread over the surface by graphene to increase dissipation area. Moreover, graphene-based heat dissipation coating in this invention has heat radiation effects that dissipate heat more efficiently.

Figures 10A, 10B, 10C:
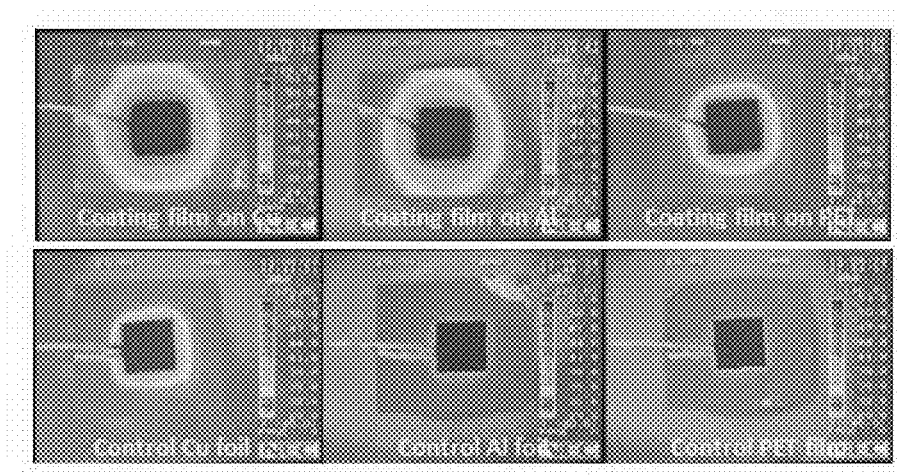
FIGS. 10A to 10C show the graphene film coated on different substrates demonstrating superior ability for heat dissipation according to the preferred embodiment of the present invention.

As shown in FIGS. 10A to 10C, the graphene-based heat dissipation film coated on different substrates demonstrating superior ability for heat dissipation. In comparison with pure substrate without graphene film coating, IR images clearly show outstanding heat spreading ability of graphene film on all three substrate, copper, aluminum, and PET. According to the preferred embodiment of the present invention, severe hot spot from LED arrays on filaments can be effectively alleviated by coating graphene-based heat dissipation coating.

Figure 11:
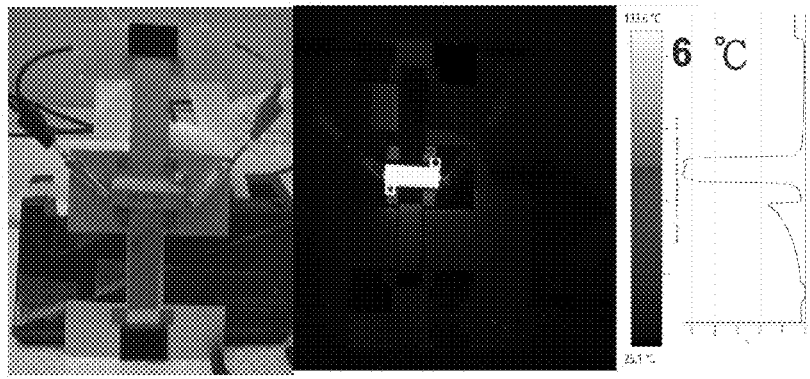
FIG. 11 shows a huge dissipation path in which graphene coating illustrated obvious heat spreading effect. The terminal temperature with and without graphene coating has a 6° C. difference from thermal image measurement, indicating a great heat dissipation effect according to the preferred embodiment of the present invention.

People typically use white and reflecting materials in LED because they think white can reflect and black only absorb light. On the contrary, in our light bulb and in our present invention, we found the heat radiation effect by our graphene-based heat dissipation film. As shown in FIG. 11, thermal image test is illustrated with lower side of substrate coated with graphene-based heat dissipation film in the middle of heat dissipation path, while upper side of substrate as control. Heat radiation meter detects obvious heat radiation on the area of graphene-based heat dissipation films, while no heat dissipation on the control. The temperature difference on two ends is 6° C., which indicates efficient heat radiation ability of graphene-based heat dissipation film. So the Graphene filament which inside the LED light bulb can dissipate heat away from a never invented path: radiation through space/air.

Figure 12:
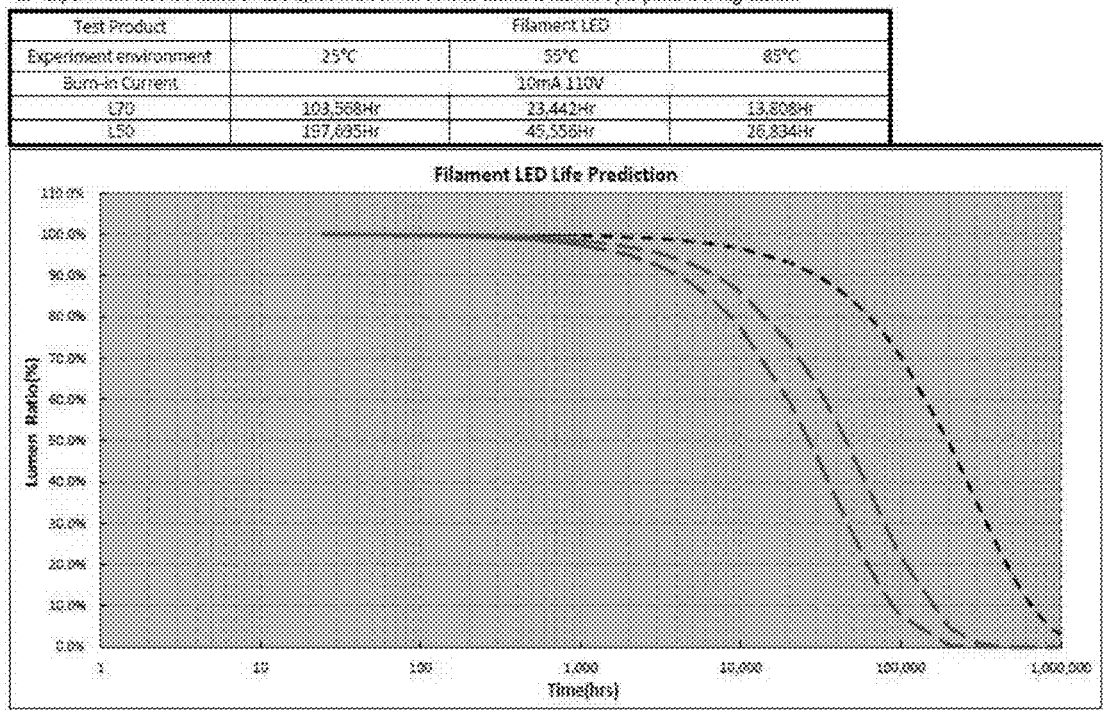
FIG. 12 shows, the LED light bulb with the Graphene filament is tested according to the preferred embodiment of the present invention.

With reference to FIG. 12, the LED light bulb with the Graphene filament is tested based on LED 1,000 hours burn in data and found LED life by exponential regression. The data shows improved lifetime of LED light bulb in the preferred embodiment of the present invention.

From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims.

What is claimed is:

1. A method of making a LED light bulb with the Graphene filament according to a preferred embodiment comprises steps of:
   A. providing a flexible substrate, wherein the flexible substrate is flexible printed circuit board (PCB);
   B. coating graphene-based heat dissipation ink on a back side of the flexible substrate, wherein the graphene-based heat dissipation ink is dried so as to form a graphene-based radiation film forms on the back side of the flexible substrate;
   C. cutting the printed circuit board (PCB) on which the graphene-based radiation film is coated to form plural Graphene filaments; and
   D. fixing the plural Graphene filaments into a light bulb.

2. The method of making the LED light bulb as claimed in claim 1, wherein the flexible substrate has copper lines formed on both sides thereof for electronic circuits and heat conduction, and LED chips are mounted on a front side of the flexible substrate.

3. The method of making the LED light bulb as claimed in claim 1, wherein the graphene-based heat dissipation ink is coated on the back side of the flexible substrate before or after LED chips/phosphor molding and then is dried.

4. The method of making the LED light bulb as claimed in claim 1, wherein the graphene-based heat dissipation ink consists of graphene, heat dissipation fillers, dispersants and binders, such that the graphene-based heat dissipation ink takes both lateral heat spreading ability and heat radiation ability to dissipate heat.

5. The method of making the LED light bulb as claimed in claim 1, wherein the graphene-based radiation film is coated by any one of spray coating, brushing, screen printing, or nozzle printing via the graphene-based heat dissipation ink.

6. The method of making the LED light bulb as claimed in claim 1, wherein the Graphene filaments are fixed in a bended or arched position.

7. The method of making the LED light bulb as claimed in claim 1, wherein the heat dissipation fillers are at least one of carbon materials, metal particles and far infrared-ray radiation powders.

8. The method of making the LED light bulb as claimed in claim 7, wherein the carbon materials include at least one of graphene, carbon black, graphite, carbon nanotubes, activated carbon.

9. The method of making the LED light bulb as claimed in claim 7, wherein the metal particles include at least one of Cu, Ni, Zn, Fe, Co, Ag, Au, Pt and their alloys.

10. The method of making the LED light bulb as claimed in claim 7, wherein the far infrared-ray radiation powders include at least one of $SiO_2$, $Al_2O_3$, $TiO_2$, $ZrO_2$, ZrC, SiC, TaC, $TiB_2$, $ZrB_2$, $TiSi_2$, $Si_3N_4$, TiN, BN.

* * * * *